United States Patent [19]

Maerz et al.

[11] Patent Number: 5,627,009
[45] Date of Patent: *May 6, 1997

[54] PROCESS FOR THE PRODUCTION OF A MULTICOLORED IMAGE

[75] Inventors: Karin Maerz, Mainz; Ine Gramm, Wiesbaden; Manfred Hilger, Konz; Dieter Mohr, Budenheim; Stephan J. W. Platzer, Eltville-Erbach, all of Germany

[73] Assignee: Agfa-Gevaert AG, Leverkusen, Germany

[ * ] Notice: The term of this patent shall not extend beyond the expiration date of Pat. No. 5,534,384.

[21] Appl. No.: 533,971

[22] Filed: Sep. 26, 1995

Related U.S. Application Data

[62] Division of Ser. No. 62,882, May 17, 1993, Pat. No. 5,478,694.

[30] Foreign Application Priority Data

May 18, 1992 [DE] Germany .......................... 42 16 359.5

[51] Int. Cl.$^6$ .................................................. G03C 11/12
[52] U.S. Cl. .......................... 430/257; 430/260; 430/262; 430/263; 430/253; 430/254; 430/273.1; 430/281.1; 430/288.1; 430/293
[58] Field of Search ..................................... 430/257, 260, 430/262, 263, 253, 254, 273, 281, 288, 293

[56] References Cited

U.S. PATENT DOCUMENTS

| | | | |
|---|---|---|---|
| 4,511,641 | 4/1985 | Busman et al. | 430/253 |
| 4,740,600 | 4/1988 | Eion et al. | 430/253 |
| 4,895,787 | 1/1990 | Platzer | 430/253 |
| 4,980,096 | 12/1990 | Eion et al. | 260/404 |
| 5,478,694 | 12/1995 | Maerz et al. | 430/257 |
| 5,534,384 | 7/1996 | Platzer et al. | 430/260 |

FOREIGN PATENT DOCUMENTS

| | | |
|---|---|---|
| 0357324 | 3/1990 | European Pat. Off. . |
| 0525624 | 2/1993 | European Pat. Off. . |

*Primary Examiner*—Geraldine Letscher
*Attorney, Agent, or Firm*—Foley & Lardner

[57] ABSTRACT

The invention relates to a photosensitive material for the production of color proofing films for multicolor printing comprising:

A) a transparent, flexible film support,
B) a photopolymerizable layer containing:
   B1) a polymeric binder,
   B2) a free radical-polymerizable compound,
   B3) a compound which is capable of initiating the polymerization of (B2) on exposure to actinic light, and
   B4) a dye or colored pigment in a primary color of multicolor printing, and
C) a thermoplastic adhesive layer on the photosensitive layer, which contains at least about 1.5% by weight of a water-soluble, colorless, low-molecular-weight salt whose aqueous solution is not highly acidic.

The material is processed by lamination onto an image-receiving material, exposure and peeling apart of the film support and the image-receiving material, the unexposed areas of the layer and the adhesive layer remaining on the image-receiving material. The addition of the salt to the adhesive layer substantially reduces the adhesion between this layer and the exposed areas of the photopolymerizable layer.

15 Claims, No Drawings

PROCESS FOR THE PRODUCTION OF A MULTICOLORED IMAGE

This is a divisional of application Ser. No. 08/062,882 filed on May 17, 1993, U.S. Pat. No. 5,478,694.

The invention relates to a photosensitive, photopolymerizable, material for the production of color proofing films for multicolor printing. It further relates to a color proofing method in which a multicolored image comprising a plurality of images in primary colors in register is produced on an image-receiving material. The images in primary colors are produced by laminating a photopolymerizable layer which has been dyed in a primary color onto the image-receiving material, exposing the layer under the corresponding color separation, developing the image by peeling off the film support of the photopolymerizable layer together with the non-image areas, and repeating the same steps with a photopolymerizable layer in another primary color.

A color proofing method of this general type and a material intended for this general purpose are disclosed in U.S. Pat. No. 4,895,787. This material comprises a transparent film support whose surface has preferably been adhesion pretreated, a photopolymerizable layer containing a dye or a colored pigment in a primary color of multicolor printing, and a heat-activatable adhesive layer on the photopolymerizable layer. The material is laminated onto an image-receiving material, exposed through the film support and developed by peeling apart the film support and the image-receiving material, leaving the exposed areas of the colored photosensitive layer on the support, and the non-exposed areas together with the entire adhesive layer on the image-receiving material. The method thus works positively, i.e. a positive copy of the original is produced on the image-receiving material.

This processing method has the great advantage that development does not require any alkaline or acidic solutions or organic solvents, and disposal thereof is thus unnecessary. A disadvantage of this method of the prior art is that the adhesive forces and thus peel forces increase in the first weeks after production of the films, as a consequence of diffusion and conditioning processes. The properties necessary for clean, problem-free image development by peeling apart thus deteriorate, in particular the low adhesion between the colored photosensitive layer and the adhesive layer which is necessary for this method.

The earlier German patent application P 42 04 950.4 (Hoe 92/K005) has already proposed adding a colorless pigment having a particle size corresponding to from 1 to 100%, preferably from 20 to 70%, of the layer thickness to the adhesive layer. This addition reduces the surface tack.

The adhesive layer described in the earlier patent application further contains an addition of about 1.4% by weight of sodium sulfite. This addition is necessary if the polymeric binder of the adhesive layer, a vinyl acetate/crotonic acid copolymer, is already in aqueous solution and is to be stored for an extended period, i.e. for some weeks or longer, in this solution. Such aqueous solutions tend to turn brown, which can be prevented by addition of the reducing agent sodium sulfite. It is assumed that the discoloration is due to autoxidation of monomeric crotonic acid present in the polymer. This addition is unnecessary if the polymer is stored as a solid substance and is dissolved in water just before the coating operation.

The excessive adhesion of the adhesive layer to the colored layer causes a number of unsatisfactory properties in the materials employed for the production of color proofing films by the peel-apart method. They frequently give images having an undesired background coloration and having an uneven, rough surface of the background or non-image areas. The exposure times are relatively long since the exposed areas adhere strongly to the adhesive layer. The image-differentiating degree of photopolymerization must therefore be greater than in the case of low adhesion between the adhesive layer and the colored layer.

The object of the present invention is, therefore, to provide a photosensitive material and a color proofing method in which the adhesion between the exposed, colored photopolymerizable layer and the adhesive layer has been reduced, so that less image exposure is necessary, and less background discoloration and increased surface sheen of the image background are produced.

The invention relates to a photosensitive material for the production of color proofing films for multicolor printing, comprising:

A) a transparent, flexible film support, preferably made of plastic,

B) a photopolymerizable layer containing:
   B1) a polymeric binder,
   B2) a free radical-polymerizable compound,
   B3) a compound which is capable of initiating the polymerization of (B2) on exposure to actinic light, and
   B4) a dye or colored pigment in a primary color of multicolor printing, and C) a thermoplastic adhesive layer on the photosensitive layer.

In the material according to the invention, the adhesive layer C contains at least 1.5% by weight of a water-soluble, colorless, low-molecular-weight salt whose aqueous solution is not highly acidic, i.e. has a pH of above about 3.

The present invention further relates to a process for the production of a multicolored image, which comprises: 1) laminating a photosensitive material of the composition indicated in claim 1 with the adhesive layer under pressure onto an image-receiving material; 2) exposing the photosensitive material imagewise through the film support with a color separation; 3) peeling the film support together with the non-image areas off from the image-receiving material; and 4) repeating the lamination, exposure and peeling-apart steps with at least one further color separation, the exposure being carried out in register with the first primary-color image produced on the image-receiving material.

According to another embodiment of the invention, a method for the production of a multicolored image is provided which comprises: 1) laminating an adhesive layer of the composition indicated in claim 1 onto an image-receiving material; 2) laminating a photosensitive material comprising a transparent, flexible film support and a photopolymerizable layer of the composition indicated in claim 1 with the photopolymerizable layer onto the adhesive layer; 3) exposing the photopolymerizable layer imagewise through the film support with a color separation; 4) peeling the film support together with the non-image areas off from the image-receiving material; and 5) repeating the steps:

laminating of an adhesive layer
   laminating of a photosensitive material
   exposing and
   peeling with at least one further color separation, the exposure being carried out in register with the first primary-color image produced on the image-receiving material.

Finally, the invention also relates to the use of a water-soluble, colorless, low-molecular-weight salt as an addition to a thermoplastic adhesive layer, in combination with a photopolymerizable layer of the composition indicated in claim 1, for reducing the adhesion between the thermoplastic adhesive layer and the photopolymerizable layer.

The addition of a salt to the adhesive layer according to the present invention, even in a small amount, significantly reduces the adhesion and thus the peeling force necessary for image development of the exposed areas. After addition of the salt, the adhesion at the unexposed areas, between the adhesive layer and the colored photopolymerizable layer remains greater than between the colored layer and the film support. In each individual case, the amount of salt necessary to achieve the desired reduction in adhesion can be easily determined by simple tests. Although increasing the salt concentration further reduces the adhesion and further improves the photosensitivity, and the sheen and the clarity of the image background, it simultaneously reduces the tonal range of the copy, i.e. the screen peaks are imaged just as little as the screen troughs. In each case, an optimum balance between adhesion, photosensitivity and stain on the one hand and tonal range on the other hand must therefore be struck. In general, a clear improvement can be achieved with addition of only about 0.2%, by weight, of the salt. This improvement is more significant from about 1.5% to about 10%. The upper limit is, as stated above, determined by the reduction in the tonal range. Concentrations above about 10% normally give no further advantageous results. A concentration range of from about 2% to 5% is preferred.

The salt may be inorganic or organic. The nature of the salt is usually not crucial to the result. In general, inorganic salts, in particular alkaline metals, alkaline earth metals and ammonium salts, are advantageous. It is also possible for organic cations, in particular quaternary ammonium ions, to be present. Of these, particular preference is given to cationic, surface-active salts. The anions employed are generally those of mineral acids, such as sulfuric acid, sulfurous acid, phosphoric acid, hydrohalic acids, nitric acid and the like. It is also possible to add salts of simple low-molecular-weight organic acids. The essential requirements are that the solution of the salt is not highly acidic and that the anion and cation are not polymeric. Examples of suitable salts are sodium chloride, sodium sulfite, sodium sulfate, sodium fluoride, sodium bromide, sodium iodide and the corresponding potassium, ammonium, lithium, magnesium and calcium salts. Examples of organic salts are sodium acetate, sodium propionate, sodium butyrate, sodium tartrate and sodium crotonate, the corresponding potassium, ammonium and lithium salts, and zwitter ions of amino acids. Particularly preferred organic salts are cationic surfactants. It is also possible to employ anionic surfactants, for example salts of long-chain aliphatic or aliphatic-aromatic carboxylic or sulfonic acids. The salts must be soluble in the coating solution for the adhesive layer. Since this is normally an aqueous solution, the salts should be water-soluble.

The thermoplastic adhesive layer can either be applied directly to the photopolymerizable layer from a solvent or solvent mixture which does not dissolve this layer, and then dried, or can first be applied to a temporary film support and transferred therefrom to the colored photopolymerizable layer or to the image-receiving material by lamination and peeling-off of the film support. According to another embodiment, the adhesive layer can be obtained by coating the image-receiving material from a solvent and drying the coating. The photopolymerizable layer is then transferred onto the resultant adhesive layer by lamination. Direct application from solvents to the photopolymerizable layer is preferred. A suitable solvent which does not dissolve the colored layer is water. Many polymers can be applied from aqueous dispersions; however, application from solution is preferred. Examples of salts which are suitable for this purpose are polymers containing acid groups, for example carboxyl groups. A preferred example is an aqueous-alkaline solution of a vinyl acetate/crotonic acid copolymer (Mowilith® Ct 5). Other suitable polymers are poly(vinyl acetate) and polyacrylate dispersions. The polymer should have a softening point in the range from about 40° to about 200° C., preferably from about 60° to about 130° C. In addition to the thermoplastic polymer and the salt, the adhesive layer may also contain plasticizers, adhesion promoters, residual solvents, surface-leveling agents, lubricants, antistatics, inert fillers, optical brighteners and/or UV absorbers. Their layer weight in the dry state is normally from about 2 to about 30 g/m$^2$, preferably from about 4 to about 15 g/m$^2$. Conventional adhesive layers are described in U.S. Pat. No. 4,895,787. In order to increase its cohesion force, the adhesive layer may advantageously also contain poly(vinyl alkyl ethers) as adhesion promoters, as described in the earlier German patent application P 41 25 723.5. The photopolymerizable layer of the material according to the invention contains, as essential constituents, a polymeric binder, a free radical-polymerizable compound, a compound which forms free radicals on exposure to actinic light and thus initiates the polymerization of the polymerizable compound, and a dye or colored pigment in a primary color of multicolor printing. Examples of photopolymerizable layers of this composition are described in U.S. Pat. No. 4,895,787, which is incorporated herein by reference.

The polymeric binder is intended to provide the layer with homogeneity and strength. Suitable binders include styrene-maleic anhydride and styrene-maleic monoester copolymers, acrylate polymers and copolymers, polyamides, polyvinylpyrrolidones, cellulose derivatives, such as cellulose esters and ethers, phenolic resins, polyvinyl esters, polyvinyl acetals, for example polyvinyl butyral, -propional or -formal. The proportion of the binder is normally from about 15 to about 70% by weight, preferably from about 20 to about 50% by weight, based on the weight of the solid layer.

The polymerizable compound contains at least one, preferably at least two, terminal, free radical-polymerizable double bonds and is not gaseous at temperatures below 100° C. and atmospheric pressure. Preference is given to esters and amides of acrylic and methacrylic acids. Particular preference is given to esters with polyhydric alcohols. Examples are di-, tri- and tetra- and polyethylene glycol di(meth)acrylate, the di(meth)acrylates of oligo- and polypropylene glycols, 1,4-butanediol di(meth)acrylate, trimethylolpropane and trimetholylethane di- and tri(meth)acrylate, pentaerythritol tri- and tetraacrylate or -methacrylate, dipentaerythritol tetra-, penta- and hexa (meth)acrylate. The proportion of polymerizable compound is normally from about 15 to about 70% by weight, preferably from about 20 to about 60% by weight.

Suitable photoinitiators are essentially all compounds or compound combinations known for this purpose. Examples include benzoin ethers, benzil ketals, polycyclic quinones, benzophenone derivatives, triarylimidazolyl dimers and photosensitive trihalomethyl compounds, for example trichloromethyl-s-triazines. Particular preference is given to 2-aryl-4,6-bistrichloromethyl-s-triazines. The amount of photoinitiator or photoinitiator combination is normally between about 1 and about 25% by weight, preferably between about 5 and about 15% by weight.

The dyes or colored pigments are selected so that they correspond to the primary colors of multicolor printing;

cyan, magenta, yellow and black. Pigments are generally preferred. Examples are Permanent Yellow G (C.I. 21 095), Permanent Yellow GR (C.I. 21 100), Permanent Yellow DHG (C.I. 21 090), Permanent Ruby L3B (C.I. 15 850:1), Permanent Pink F3B (C.I. 12 433), Hostaperm Pink E (C.I. 73 915), Hostaperm Red-Violet ER (C.I. 46 500), Permanent Carmine FBB (C.I. 12 485), Hostaperm Blue B2G (C.I. 74 160), Hostaperm Blue A2R (C.I. 74 160) and Printex 25 (carbon black).

If desired, the pigments can be blended in order to achieve the desired shade. The inorganic or organic pigments are generally dispersed or slurried in a suitable solvent together with some of the binder. The mean particle size is normally less than about 1 µm.

The proportion of dye or pigment is normally from about 8 to about 40% by weight, preferably from about 12 to about 30% by weight.

The photopolymerizable layer may, if desired, contain further constituents, such as hydrogen donors, sensitizers, polymerization inhibitors, plasticizers, residual solvents, surfactants, surface-leveling agents, lubricants, adhesion promoters, for example the polyvinyl alkyl ethers described in the abovementioned earlier application, antistatics, inert fillers, optical brighteners and/or UV absorbers. It normally has a layer weight of from about 0.2 to about 5 g/m$^2$, preferably from about 0.3 to about 3 g/m$^2$.

After the photopolymerizable layer has been dried, the thermoactivatable, thermoplastic adhesive layer is applied thereto.

The film supports employed are transparent, flexible, dimensionally stable films preferably made from plastics, for example polyesters, polycarbonates, etc. Particular preference is given to polyester films, in particular biaxially stretched and thermofixed films, for example made from polyethylene terephthalate. These should retain the layer dimensions at the lamination temperatures necessary, i.e. at from about 60° to about 150° C. Their thickness is normally from about 10 to about 200 µm, preferably from about 25 to about 80 µm. The film support is advantageously adhesion pretreated on one or both sides and may have a smooth surface or a rough or matt surface, preferably a smooth surface.

In order to carry out the process according to the invention, the above-described photosensitive material is laminated with the adhesive layer onto an image-receiving material. This can comprise plastic, plastic-coated special paper or normal printing paper. Other white or, if desired, non-white receiving materials can likewise be used. A printing paper which retains its dimensions under the laminating conditions is usually preferred since this allows a visual impression very close to the later print to be achieved. The lamination is expediently carried out in equipment provided for this purpose under pressure and at elevated temperature. The lamination temperature is usually in the range from about 60° to about 130° C., preferably between 70° and 100° C. After the lamination, the photopolymerizable layer is exposed imagewise in a known manner through the film support, normally in contact under a positive color separation. After the exposure, the film support is peeled off by hand or in a suitable device. The peel angle should be at least about 90°, an angle of about 180° being particularly preferred. The exposed areas of the photopolymerizable layer are removed with the film support, while the unexposed areas remain on the image-receiving material together with all the adhesive layer. In this way, a positive image in a primary color is obtained. Each further color proofing film is laminated onto the previous primary-color image in the manner described, exposed thereon in register and developed by peeling off the film support. In this way, a full multicolor image which corresponds to the later 4-color print image is obtained from the images in the primary colors cyan, magenta, yellow and black. If required, it is of course also possible to employ color proofing films in other colors.

A crucial factor for the quality of the results of the color proofing method described is careful matching of the adhesion forces and cohesion forces which act between the photopolymerizable layer and the thermoplastic adhesive layer or within these layers. The material according to the invention is distinguished by the fact that, while the adhesive layer has high cohesion force, the adhesive forces between the colored photopolymerizable layer and the adhesive layer after exposure are low. This means that only a low peel force is necessary for development, at most 3–4 times as high as the peel force necessary for the unexposed laminate. It is through these low peel forces that the material and process according to the invention differ very essentially from other commercially available materials and systems, which operate with approximately 10 times the peel force in the exposed areas and in addition aim at the greatest possible differences between the adhesive forces acting between the adhesive layer and the exposed colored layer on the one hand and the adhesive layer and the unexposed colored layer on the other hand.

However, the low peel forces necessary in the process according to the invention are crucial for the achievable image quality. Low peel forces enable a manual, even peeling operation for image development, even in the case of very large formats (70×100 cm). Peeling machines are thus superfluous. The dot contours remain clean, and the exposure times necessary for the optimum tonal range of about 2–98% are shortened. Since the exposed colored layer can be separated very easily from the adhesive layer, the image background (=adhesive layer surface without colored layer) exhibits high sheen, comparable to the image areas, attributable, according to microscopic studies, to a completely closed layer surface. High peel forces, by contrast, result in tearing of the dot contours and of the adhesive layer surface during development. The image areas appear glossy against a matt image background, which has an adverse affect on the overall image impression. A further advantage is background stain is substantially reduced at low peel forces, since hardly any colored layer residues remain on the adhesive layer surface.

In the examples below, the adhesive layer is normally prepared using an aqueous polymer solution which, as stated at the outset, contains about 1.4% of sodium sulfite for stabilization. Examples 1 and 7 show that even just this addition achieves a considerable improvement compared with a layer containing no sodium sulfite (comparative example). In the examples, the peel force necessary to separate the film support and the image-receiving sheet is indicated. It is measured at a peel rate of 1 m/minute at an angle of 180°. The exposure time shown is that at which optimum image resolution, i.e. the greatest tonal range during development, is achieved. The exposure time, like the peel force, is shown in relative values. In each case, the value obtained for the same color with an adhesive layer containing 1.4% of sodium sulfite is set at 100.

Indication of absolute values is inappropriate since these depend on so many individual parameters of the experimental procedure that they are not meaningful.

The surface gloss of the image background is measured using a reflectometer (RL3, Dr. B. Lange, Berlin, Standard A). The measure of the surface gloss is the reflected light intensity. This is measured at the angles 20°, 60° and 85° to the image plane. The higher the values, the greater the gloss.

As a measure of the background stain, the optical density in the non-image areas is determined using a densitometer.

In order to increase the measured values, a colored film is laminated onto the receiving sheet and exposed for the previously determined optimum exposure time, i.e. the time after which the greatest tonal range is achieved. After the film support has been peeled off, the process is repeated a further three times with an identical colored film under identical conditions. The reference used for the measurement of the background stain is the optical density of the image-receiving sheet before the first lamination.

The tonal range denotes the dots in a 60 lines per cm linear screen reproduced in the developed copy. A 10% screen dot means that, in the case of uniform covering with dots of this size, 10% of the surface is covered by dots.

The invention is illustrated by the examples below. Amounts are given in parts by weight (pbw). Percentages and mixing ratios are based on weight units, unless otherwise stated.

EXAMPLE 1

The coating solutions for the photopolymerizable layers comprise the following components, in parts by weight.

The colored pigments are mixed to provide better matching to commercially available printing inks.

|  | Cyan | Magenta | Yellow | Black |
| --- | --- | --- | --- | --- |
| Dipentaerythritol penta-acrylate | 39.0 | 35.5 | 38.2 | 36.1 |
| 2-Biphenyl-4-yl-4,6-bistri-chloromethyl-s-triazine | 9.8 | 7.8 | 9.5 | 9.6 |
| Polyvinylformal binder (Formvar ® 12/85) | 31.3 | 36.5 | 35.4 | 28.0 |
| Hostaperm ® Blue B2G (C.I. 74 160) | 19.0 | — | — | — |
| Permanent Carmine FBB (C.I. 12 485) | — | 18.5 | — | — |
| Permanent Yellow GR (C.I. 21 100) | — | 0.7 | 16.4 | — |
| Carbon black (Printex ® 25) | 0.4 | 0.5 | — | 24.8 |
| Silicone oil (Edaplan ® LA 411) | 0.5 | 0.5 | 0.5 | 0.6 |
| Tetrahydrofuran | 1000.0 | 1000.0 | 1000.0 | 1000.0 |
| 1-Methoxy-2-propanol | 680.0 | 680.0 | 680.0 | 680.0 |
| gamma-Butyrolactone | 190.0 | 190.0 | 190.0 | 190.0 |

The pigments are dispersed with some of the binder and some of the butyrolactone. The mean particle size is below 200 nm. The dispersion and the remaining constituents are mixed and applied to a 50 µm thick, biaxially stretched and thermofixed polyethylene terephthalate film which has been adhesion pretreated on both sides (Melinex® 505 film). The layers are dried at 70° C. The layer weights are between 0.6 and 0.8 g/m.

The adhesive layer solution has the following composition:

| Vinyl acetate-crotonic acid copolymer 95:5 Mowilith ® CT5 | 96.6 pbw |
| --- | --- |
| Polyvinyl methyl ether (Lutonal ® M 40) | 1.9 pbw |
| Sodium sulfite | 1.4 pbw |
| Water | 520.0 pbw |
| Ethanol | 43.0 pbw |
| Ammonia water, 25% strength | 8.5 pbw |

The solution is applied to the dry photopolymerizable layers and dried. The layer weight of the dry adhesive layer is 6.5 g/m².

One of the films produced in this way, e.g. the cyan film, is laminated at 85° C. onto plastic-coated special paper and exposed under the cyan separation film. The film support is peeled off continuously by hand at an angle of 180°. The adhesive layer and the positive cyan image remain on the paper, and the remaining colored films are laminated onto the cyan image one after the other.

The tonal range in a 60 lines/cm screen is 2–98% for all colors, i.e. the dots whose size corresponds to the stated area coverage in % are still reproduced.

EXAMPLE 2

The composition of the photopolymerizable colored layers corresponds to that stated in Example 1; however, the sodium sulfite content in the adhesive layer is increased as follows:

| Example | Content of Na$_2$SO$_3$ |
| --- | --- |
| 2a | 3.4 pbw |
| 2b | 4.4 pbw |
| 3c | 6.4 pbw |

Before addition, the sodium sulfite salt is dissolved in some of the water, which is a constituent of the adhesive layer solution. The finished adhesive layer solutions are in each case applied to the dry colored layers. After drying, the layer weight of the adhesive layers is 6.5 g/m². The films are processed in the manner described in Example 1 to give single-colored or multicolored images. Whereas the peel forces in the unexposed state do not change compared with Example 1, adhesive forces which are reduced by up to 76% compared with Example 1 are measured in the exposed state, depending on the color and concentration of the salt addition. The surface gloss is higher in all cases, and the exposure times are significantly shorter. The background stain is significantly reduced in the case of magenta and somewhat reduced in the case of yellow. In Example 2a, the tonal range is 2–98% for all four colors. A further increase in the salt addition results in a narrowing of the tonal range and thus in impairment of the resolution. These examples show that the peel force cannot be reduced infinitely. Table I, below, shows the values in detail.

EXAMPLE 3

In addition to the 1.4% of Na$_2$SO$_3$ present in the aqueous adhesive layer solution from Example 1 for stabilizing the residual monomeric crotonic acid, further inorganic salts are added to the adhesive layer solution:

| Example | Addition | Amount (pbw) |
| --- | --- | --- |
| 3a | NaCl | 2 |
| 3b | NaCl | 3 |
| 3c | Na$_2$SO$_4$ | 3 |
| 3d | KCl | 3 |

The coating and further processing are carried out as in Example 1. The salt additions are in each case predissolved in part of the water. The experiments are restricted to the color magenta, since the reduction in the stain here allows the advantage of the invention to be seen particularly clearly. Table I shows the values in detail.

EXAMPLE 4

2 pbw of ammonium crotonate are added to the adhesive layer solution from Example 1. The dehesive action is significantly less than in the preceding examples for the addition of inorganic salts. Nevertheless, a reduction in the background stain of 50% is achieved.

EXAMPLE 5

Various amounts of stearamidopropyldimethyl(β-hydroxyethyl)ammonium nitrate (SPDM) are added to the adhesive layer solution from Example 1. The colored layer recipes correspond to Example 1. Before addition to the adhesive layer solution, the SPDM is dissolved in the same amount of isopropanol, and some of the water used in the adhesive layer solution is added. The resultant solution must be added to the adhesive layer solution slowly, since otherwise the dissolved vinyl acetate-crotonic copolymer precipitates due to the pH of SPDM (4–6).

| Example | Addition of SPDM |
|---------|------------------|
| 5a | 1.5 pbw |
| 5b | 2.0 pbw |
| 5c | 2.5 pbw |

The coating and further processing are carried out as in Example 1. The peel force and exposure times drop continuously with increasing salt concentration. The surface gloss increases, and the effect on the background stain is significantly reduced, particularly in Example 5c. The tonal range is 2–98% in all cases. The surface tack is lower, which improves the positioning ability of the films in register and prevents the films sticking together before lamination, which results in image tears. The dot growth is reduced (1–2% in the 60 lines/cm screen at an area coverage of 40%), and the multicolored image thus becomes more similar to a printed image.

EXAMPLE 6

The mode of action of cationic surfactants is demonstrated by means of two further examples:

| Example | Addition |
|---------|----------|
| 6a | 0.75 pbw of distearyldimethylammonium chloride (Präpagen ® WK) |
| 6b | 5.0 pbw of trioctylmethylammonium chloride |

In both cases, incorporation into the adhesive layer solution must be carried out slowly and with stirring. Further processing can only be carried out after complete dissolution of the additions in the manner described. In both cases, a reduction in the exposure time and in background staining in the case of magenta is observed, but the action of trioctylmethylammonium chloride is significantly weaker than that of Präpagen WK. The individual values are shown in Table I.

COMPARATIVE EXAMPLE (V)

A magenta color proofing film is produced as described in Example 1, but no sodium sulfite is added during preparation of the adhesive layer as in Example 1. The amount of polyvinyl methyl ether remains unchanged. If the coating solution is processed within a few days, its appearance does not change.

The comparison shows that a significantly longer exposure time and a peel force more than twice that of the corresponding colored film from Example 1 are necessary. The gloss and tonal range are likewise significantly worse. The exposure time is again relative to the time shown in Example 1 for the same color, which is set at 100.

TABLE I

| Example No. | Addition | Amount (pbw) | Color | Relative exposure time | Relative peel force | Image background Gloss (20/60/85°) | Background stain | Tonal range (%) |
|---|---|---|---|---|---|---|---|---|
| 1 | Sodium sulfite | 1.4 | C | 100 | 100 | 11.0/27.3/74.0 | 0.03 | 2–98 |
| | | | M | 100 | 100 | 4.4/12.4/33.6 | 0.07 | 2–98 |
| | | | Y | 100 | 100 | 4.2/21.1/53.6 | 0.08 | 2–98 |
| | | | K | 100 | 100 | 11.6/38.6/86.4 | 0.00 | 2–98 |
| 2a | Sodium sulfite | 3.4 | C | 50 | 45 | 31.7/50.8/79.5 | 0.02 | 2–98 |
| | | | M | 38 | 51 | 36.7/61.2/90.5 | 0.04 | 2–98 |
| | | | Y | 52 | | 26.3/49.5/60.6 | 0.06 | 2–98 |
| | | | K | 34 | 57 | 38.3/69.2/93.3 | 0.00 | 2–98 |
| 2b | Sodium sulfite | 4.4 | M | 30 | | 44.9/73.8/96.5 | <0.01 | 10–97 |
| 2c | Sodium sulfite | 6.4 | M | 24 | 35 | 59.9/82.6/97.6 | <0.01 | 10–90 |
| 3a | Sodium sulfite + NaCl | 1.4 + 2.0 | M | 40 | 100 | 45.2/75.1/95.4 | 0.02 | 3–97 |
| 3b | Sodium sulfite + NaCl | 1.4 + 3.0 | M | 25 | 100 | 60.1/82.4/96.5 | <0.01 | 10–95 |
| 3c | Sodium sulfite + sodium sulfate | 1.4 + 3.0 | M | 30 | | 59.7/80.4/94.5 | 0.01 | 10–95 |
| 3d | Sodium | 1.4 + | M | 27 | | 58.9/79.3/ | 0.01 | 10–95 |

TABLE I-continued

| Example No. | Addition | Amount (pbw) | Color | Relative exposure time | Relative peel force | Image background Gloss (20/60/85°) | Background stain | Tonal range (%) |
|---|---|---|---|---|---|---|---|---|
| | sulfite + potassium chloride | 3.0 | | | | 93.4 | | |
| 4 | Sodium sulfite + ammonium crotonate | 1.4 2.0 | M | 100 | 80 | 6.5/14.7/ 47.8 | 0.04 | 2–98 |
| 5a | Sodium sulfite + SPDM | 1.4 1.5 | C | 83 | 85 | 11.3/33.5/ 78.4 | 0.03 | 2–98 |
| | | | M | 88 | 90 | 4.7/15.4/ 34.75 | 0.06 | 2–98 |
| | | | Y | 98 | 100 | 4.5/21.7/ 54.15 | 0.08 | 2–98 |
| | | | K | 85 | 95 | 15.2/41.7/ 88.3 | 0.00 | 2–98 |
| 5b | Sodium sulfite + SPDM | 1.4 2.0 | C | 65 | | 15.9/37.8/ 81.2 | 0.02 | 2–98 |
| | | | M | 80 | | 9.9/28.3/ 46.35 | 0.04 | 2–98 |
| | | | Y | 70 | | 8.5/19.4/ 60.3 | 0.07 | 2–98 |
| | | | K | 63 | | 18.3/47.9/ 91.5 | 0.00 | 2–98 |
| 5c | Sodium sulfite + SPDM | 1.4 2.5 | C | 53 | 73 | 19.8/42.4/ 84.7 | 0.02 | 2–98 |
| | | | M | 70 | 57 | 15.3/31.9/ 57.2 | 0.04 | 2–98 |
| | | | Y | 60 | 77 | 10.5/31.2/ 62.4 | 0.04 | 2–98 |
| | | | K | 46 | 78 | 27.1/59.0/ 94.2 | 0.00 | 2–98 |
| 6a | Sodium sulfite + Präpagen WK | 1.4 0.75 | M | 56 | | 52.6/76.1/ 94.6 | 0.03 | 3–98 |
| 6b | Sodium sulfite + Trioctyl- methyl- ammonium chloride | 1.4 5.0 | M | 90 | | 15.6/30.5/ 84.4 | 0.05 | 2–97 |
| V | — | — | M | 130 | 210 | 4.0/11.8/ 30.5 | 0.09 | 5–95 |

EXAMPLE 7

The 2-biphenyl-4-yl-4,6-bistrichloromethyl-s-triazine from Example 1 is replaced as photoinitiator by 2,3-bis(4-methoxyphenyl)quinoxaline. The colored layers have the following composition, in parts by weight:

| | Cyan | Magenta | Yellow | Black |
|---|---|---|---|---|
| Dipentaerythritol pentaacrylate | 39.0 | 35.5 | 38.2 | 36.1 |
| 2,3-Bis(4-methoxyphenyl)quinoxaline | 9.8 | 7.8 | 9.5 | 9.6 |
| Polyvinylformal | 31.3 | 36.5 | 35.4 | 28.0 |
| Hostaperm ® Blue B2G | 19.0 | — | — | — |
| Permanent Carmine FBB | — | 18.5 | — | — |
| Permanent Yellow GR | — | 0.7 | 16.4 | — |
| Carbon black | 0.4 | 0.5 | — | 24.8 |
| Silicone oil (Edaplan ® LA 411) | 0.5 | 0.5 | 0.5 | 0.6 |
| Tetrahydrofuran | 1000.0 | 1000.0 | 1000.0 | 1000.0 |
| 1-Methoxy-2-propanol | 680.0 | 680.0 | 680.0 | 680.0 |
| gamma-Butyrolactone | 190.0 | 190.0 | 190.0 | 190.0 |

The colored layers were produced in the manner described in Example 1.

In addition to the constituents described in Example 1, the adhesive layer solution may also contain inert particles, for example $SiO_2$, in order to improve the sliding properties and to additionally reduce the surface tack. The adhesive layer solution then had the following composition:

| Constituent | pbw |
|---|---|
| Vinyl acetate/crotonic acid copolymer 95:5 | 96.6 |
| Polyvinyl methyl ether | 1.9 |

-continued

| Constituent | pbw |
| --- | --- |
| Sodium sulfite | 1.4 |
| Water | 520.0 |
| Ethanol | 43.0 |
| Ammonia water, 25% strength | 8.5 |
| Pyrogenic silica, (mean particle size 3 μm) | 0.1 |

The silica was incorporated into part of the binder and solvent using a dissolver disk. The application of the adhesive layer and the further processing of the films follow the description of Example 1.

Due to the change of initiator, the exposure times were approximately twice as long as in Example 1 for all four colors. The background stain was even greater than in Example 1 for the color yellow due to diffusion of the pale yellow quinoxaline into the adhesive layer.

Here too, addition of a larger amount of salt allowed a significant improvement to be achieved, as shown by Example 8.

The solution was applied to the dry colored layers. After drying, the layer weight of the adhesive layer was 6.5 g/m².

EXAMPLE 8

The $Na_2SO_3$ content in the adhesive layer solution from Example 7 was increased to a total amount of 3.4% by weight, based on the non-volatile constituents of the adhesive layer solution. This adhesive layer solution was applied to the photopolymerizable colored layers from Example 7 and dried.

The peel forces were reduced by 50–70% and the exposure times by 40–60% compared with Example 7. As in Example 2, the background stain was again significantly improved for magenta and yellow. Since the addition of $SiO_2$ particles eliminates the surface tack, the addition of sodium sulfite had no further effect on the surface tack.

TABLE II

| Example No. | Addition | Amount (pbw) | Color | Relative exposure time | Background Stain | Tonal range (%) |
| --- | --- | --- | --- | --- | --- | --- |
| 7 | Sodium sulfite | 1.4 | C | 200 | 0.03 | 2–98 |
|  |  |  | M | 240 | 0.07 | 2–98 |
|  |  |  | Y | 270 | 0.13 | 2–98 |
|  |  |  | K | 270 | 0.00 | 2–98 |
| 8 | Sodium sulfite | 3.4 | C | 90 | 0.02 | 5–95 |
|  |  |  | M | 95 | 0.04 | 5–95 |
|  |  |  | Y | 130 | 0.08 | 5–95 |
|  |  |  | K | 110 | 0.00 | 5–95 |

What is claimed:

1. A process for the production of a multicolored image, which comprises:

(1) laminating a photosensitive material under pressure onto an image-receiving material, wherein the photosensitive material comprises:
  (A) a transparent, flexible film support,
  (B) a photopolymerizable layer comprising:
    (B1) a polymeric binder,
    (B2) a free radical-polymerizable compound,
    (B3) a compound which is capable of initiating the polymerization of (B2) on exposure to actinic light, and
    (B4) a dye or colored pigment in a primary color of multicolor printing, and
  (C) a thermoplastic adhesive layer on the photopolymerizable layer, wherein the adhesive layer (C) comprises at least about 1.5% by weight of a water soluble, colorless, low molecular weight salt whose aqueous solution has a pH of above about 3, (2) exposing the photosensitive material imagewise through the film support with a color separation, (3) peeling the film support together with the exposed areas off from the image-receiving material to produce a first positive image in a primary color, and (4) repeating the steps (1)–(3) with at least one further color separation, the exposure being carried out in register with the first primary-color image on the image-receiving material.

2. A process for the production of a multicolored image, which comprises:

(1) laminating a thermoplastic adhesive layer onto an image-receiving material, wherein the adhesive layer comprises at least about 1.5% by weight of a water soluble, colorless, low molecular weight salt whose aqueous solution has a pH of above about 3, (2) laminating a photosensitive material comprising a transparent, flexible film support and a photopolymerizable layer with the photopolymerizable layer onto the adhesive layer, wherein the photopolymerizable layer comprises:
  (a) a polymeric binder,
  (b) a free radical-polymerizable compound,
  (c) a compound which is capable of initiating the polymerization of (b) on exposure to actinic light, and
  (d) a dye or colored pigment in a primary color of multicolor printing, and (3) exposing the photopolymerizable layer imagewise through the film support with a color separation, (4) peeling the film support together with the exposed areas off from the image-receiving material to produce a first positive image in a primary color, and (5) repeating the steps (1)–(4) with at least one further color separation, the exposure being carried out in register with the first primary-color image produced on the image-receiving material.

3. The process as claimed in claim 1, wherein the thermoplastic adhesive layer is applied directly to the photopolymerizable layer from a solvent or solvent mixture which does not dissolve the adhesive layer, and then dried.

4. The process as claimed in claim 1, wherein the thermoplastic adhesive layer is applied to a temporary film support and transferred therefrom to the colored photopolymerizable layer or to the image-receiving material by lamination and then peeled-off of the temporary film support.

5. The process as claimed in claim 1 or 2, wherein the dyes or colored pigments are selected from the group consisting of cyan, magenta, yellow and black.

6. The process as claimed in claim 1 or 2, wherein the image-receiving material is paper.

7. The process as claimed in claim 1 or 2, wherein the film support is peeled-off from the image-receiving material at an angle of at least 90°.

8. The process as claimed in claim 1 or 2, wherein the film support is peeled off from the image-receiving material at an angle of about 180°.

9. The process as claimed in claim 1 or 2, wherein the adhesive forces between the photopolymerizable layer and the adhesive layer after exposure are at most 3–4 times as high as the peel force necessary for the unexposed areas.

10. The process as claimed in claim 1 or 2, wherein the film support is manually peeled-off from the image-receiving material.

11. The process as claimed in claim 1 or 2, wherein the salt has an inorganic cation.

12. The process as claimed in claim 1 or 2, wherein the salt is a quaternary ammonium salt.

13. The process as claimed in claim 1 or 2, wherein the salt comprises the anion of a mineral acid or of an organic, low-molecular weight acid.

14. The process as claimed in claim 1 or 2, wherein the adhesive layer comprises from 2 to 5% by weight of the water-soluble salt.

15. A multicolored image produced by the process as claimed in claim 1 or 2.

* * * * *